(12) United States Patent
Ha et al.

(10) Patent No.: US 8,823,160 B2
(45) Date of Patent: Sep. 2, 2014

(54) INTEGRATED CIRCUIT PACKAGE SYSTEM HAVING CAVITY

(75) Inventors: Jong-Woo Ha, Seoul (KR); DaeSik Choi, Seoul (KR); DeokKyung Yang, Hanam-si (KR)

(73) Assignee: STATS ChipPAC Ltd., Singapore (SG)

( * ) Notice: Subject to any disclaimer, the term of this patent is extended or adjusted under 35 U.S.C. 154(b) by 697 days.

(21) Appl. No.: 12/197,209

(22) Filed: Aug. 22, 2008

(65) Prior Publication Data

US 2010/0044878 A1 Feb. 25, 2010

(51) Int. Cl.
*H01L 23/48* (2006.01)
*H01L 25/10* (2006.01)
*H01L 23/498* (2006.01)
*H01L 23/00* (2006.01)
*H01L 23/31* (2006.01)

(52) U.S. Cl.
CPC . *H01L 23/49811* (2013.01); *H01L 2924/15311* (2013.01); *H01L 2224/48227* (2013.01); *H01L 2224/32225* (2013.01); *H01L 2224/48091* (2013.01); *H01L 24/48* (2013.01); *H01L 2225/06568* (2013.01); *H01L 2225/1088* (2013.01); *H01L 2924/3511* (2013.01); *H01L 2924/15331* (2013.01); *H01L 2224/32145* (2013.01); *H01L 23/3128* (2013.01); *H01L 2224/73265* (2013.01); *H01L 25/105* (2013.01); *H01L 2225/1058* (2013.01); *H01L 2225/1023* (2013.01); *H01L 2224/48225* (2013.01)
USPC .......................................................... 257/690

(58) Field of Classification Search
CPC .................................................. H01L 23/3157
USPC .................................. 438/112, 127; 257/690
See application file for complete search history.

(56) References Cited

U.S. PATENT DOCUMENTS

| | | | |
|---|---|---|---|
| 5,642,261 A | 6/1997 | Bond et al. | |
| 5,696,666 A | 12/1997 | Miles et al. | |
| 6,020,221 A | 2/2000 | Lim et al. | |
| 6,072,233 A | 6/2000 | Corisis et al. | |
| 6,117,704 A | 9/2000 | Yamaguchi et al. | |
| 6,168,972 B1 | 1/2001 | Wang et al. | |
| 6,172,491 B1 | 1/2001 | Nathan | |
| 6,387,731 B1 | 5/2002 | Wensel et al. | |
| 6,388,333 B1 | 5/2002 | Taniguchi et al. | |
| 6,501,184 B1 | 12/2002 | Shin et al. | |
| 6,564,454 B1 | 5/2003 | Glenn et al. | |
| 7,653,991 B2 | 2/2010 | Mok et al. | |
| 7,669,320 B2 | 3/2010 | Hurwitz et al. | |
| 7,718,901 B2 | 5/2010 | Takahash et al. | |
| 7,884,466 B2 | 2/2011 | Ishihara et al. | |
| 2002/0163064 A1 | 11/2002 | Aquien et al. | |
| 2005/0056942 A1 | 3/2005 | Pogge et al. | |
| 2005/0130349 A1 | 6/2005 | Sunohara | |
| 2006/0170090 A1* | 8/2006 | Shinma et al. | 257/686 |
| 2006/0255449 A1 | 11/2006 | Lee et al. | |

(Continued)

OTHER PUBLICATIONS

U.S. Appl. No. 12/192,052, Aug. 14, 2008, Park et al.

*Primary Examiner* — Yu-Hsi D Sun
(74) *Attorney, Agent, or Firm* — Ishimaru & Associates LLP

(57) ABSTRACT

An integrated circuit package system includes providing a carrier having a first side and a second side; mounting an integrated circuit over the carrier with the first side facing the integrated circuit; attaching an external interconnect to the second side; and forming an encapsulation over the integrated circuit and around the external interconnect with the external interconnect exposed from the encapsulation and with the encapsulation and the second side forming a cavity.

20 Claims, 3 Drawing Sheets

(56) References Cited

U.S. PATENT DOCUMENTS

| | | |
|---|---|---|
| 2007/0096292 A1 | 5/2007 | Machida |
| 2007/0148822 A1 | 6/2007 | Haba et al. |
| 2007/0158806 A1 | 7/2007 | Kwon et al. |
| 2007/0190690 A1 | 8/2007 | Chow et al. |
| 2007/0215380 A1* | 9/2007 | Shibamoto .................. 174/260 |
| 2007/0273049 A1 | 11/2007 | Khan et al. |
| 2007/0290319 A1 | 12/2007 | Kim |
| 2007/0290376 A1 | 12/2007 | Zhao |
| 2008/0029870 A1 | 2/2008 | Chen et al. |
| 2008/0090335 A1 | 4/2008 | Morimoto et al. |
| 2008/0128865 A1 | 6/2008 | Chia |
| 2008/0185704 A1 | 8/2008 | Hsu et al. |
| 2008/0197491 A1 | 8/2008 | Matsui |
| 2008/0230887 A1 | 9/2008 | Sun et al. |
| 2008/0258286 A1 | 10/2008 | Gerber et al. |
| 2008/0258289 A1 | 10/2008 | Pendse et al. |
| 2008/0263860 A1 | 10/2008 | Mok et al. |
| 2008/0265395 A1 | 10/2008 | Hasegawa et al. |
| 2008/0280394 A1 | 11/2008 | Murtuza et al. |
| 2009/0042336 A1 | 2/2009 | Paik et al. |
| 2009/0096097 A1 | 4/2009 | Kagaya et al. |
| 2009/0107708 A1 | 4/2009 | Takahashi et al. |
| 2009/0215231 A1 | 8/2009 | Inoue |
| 2009/0243065 A1 | 10/2009 | Sugino et al. |
| 2010/0044853 A1 | 2/2010 | Dekker et al. |
| 2011/0108875 A1 | 5/2011 | Takenaka et al. |

* cited by examiner

INTEGRATED CIRCUIT PACKAGE SYSTEM HAVING CAVITY

CROSS-REFERENCE TO RELATED APPLICATION

The present application contains subject matter related to U.S. patent application Ser. No. 12/192,052, now U.S. Pat. No. 7,989,950. The related application is assigned to STATS ChipPAC Ltd.

TECHNICAL FIELD

The present invention relates generally to an integrated circuit package system and more particularly to an integrated circuit package system with an encapsulation.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package on package (POP).

Both PIP and POP designs have their own challenges. For example, PIP designs have yield fallout due to final testing of the PIP device. POP designs have large height and space requirements to accommodate for the stacked devices.

Thus, a need still remains for an integrated circuit package system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including providing a carrier having a first side and a second side; mounting an integrated circuit over the carrier with the first side facing the integrated circuit; attaching an external interconnect to the second side; and forming an encapsulation over the integrated circuit and around the external interconnect with the external interconnect exposed from the encapsulation and with the encapsulation and the second side forming a cavity.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
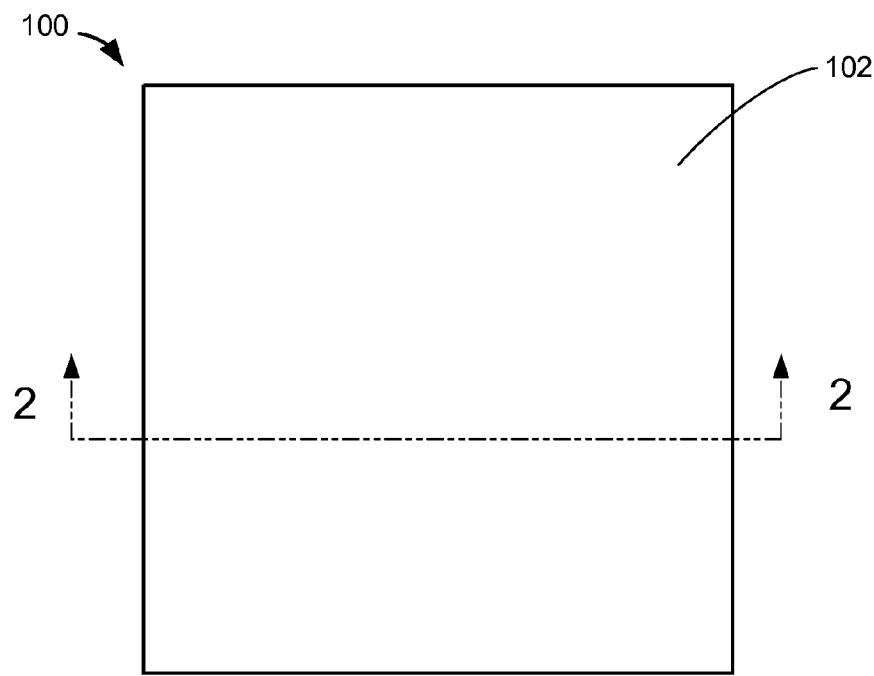
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package system 100 in a first embodiment of the present invention. The top view depicts an encapsulation 102, such as a cover including an epoxy molding compound. For illustrative purposes, the integrated circuit package system 100 is shown with the encapsulation 102 having a square geometric configuration, although it is understood that the encapsulation can have a different geometric configuration. For example, the integrated circuit package system 100 can have a rectangular configuration.

Figure 2:
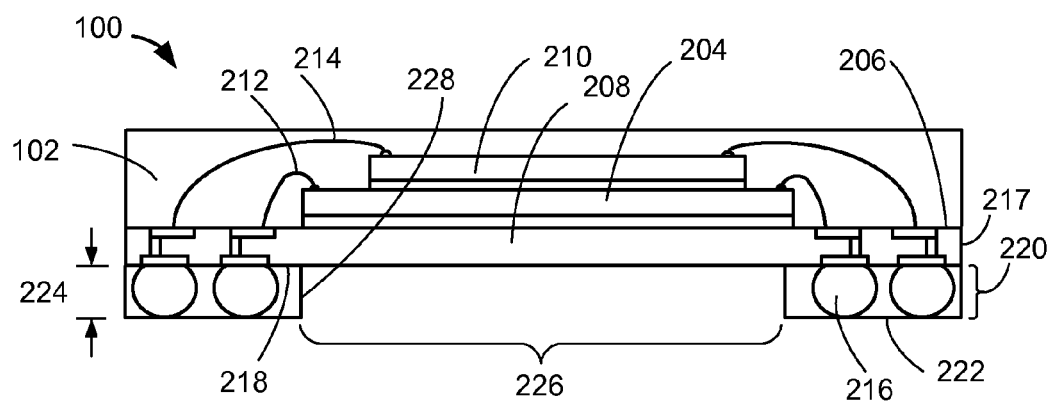
FIG. 2 is a cross-sectional view of the integrated circuit package system along line 2-2 of FIG. 1.

Referring now to FIG. 2, therein is showing a cross-sectional view of the integrated circuit package system 100 along line 2-2 of FIG. 1. A first integrated circuit 204, such as an integrated circuit die, can be mounted over and connected to a first side 206 of a carrier 208, such as a laminated substrate. A second integrated circuit 210, such as an integrated circuit die, can mount over the first integrated circuit 204 and can connect with the first side 206.

A first internal interconnect 212, such as a bond wire, can connect the first integrated circuit 204 to the first side 206. A second internal interconnect 214, such as a bond wire, can connect the second integrated circuit 210 and the first side 206.

An external interconnect 216, such as a solder ball, can be attached to a second side 218 of the carrier 208. For illustrative purposes, the integrated circuit package system 100 is shown with two rows of the external interconnect 216 connected along a periphery region of the carrier 208, although it is understood that the integrated circuit package system 100 can have different number of rows of the external interconnect 216. For example, the integrated circuit package system 100 can have one row of the external interconnect 216, different number of rows of the external interconnect 216 along each of carrier edges 217 of the carrier 208, or more than two rows of the external interconnect 216.

The encapsulation 102 can be over the first side 206 covering the first integrated circuit 204, the second integrated circuit 210, the first internal interconnect 212, and the second internal interconnect 214. The encapsulation 102 can also surround the external interconnect 216 along the second side 218 forming an embedded external interconnect 220. A bottom side 222 of the embedded external interconnect 220 is the side of the embedded external interconnect 220 facing away from the carrier 208.

The encapsulation 102 can expose a portion of the external interconnect 216 facing away from the carrier 208. The exposed portion of the external interconnect 216 is exposed from the bottom side 222 of the embedded external interconnect 220. The bottom side 222 can be planar such that the encapsulation 102 and the external interconnect 216 are planar to each other.

An embedded external interconnect height 224 is the distance between the second side 218 and the bottom side 222. A cavity 226 can be formed by the second side 218 and an inner vertical side 228 of the embedded external interconnect 220. A portion of the second side 218 can be exposed in the cavity 226.

Figure 3:
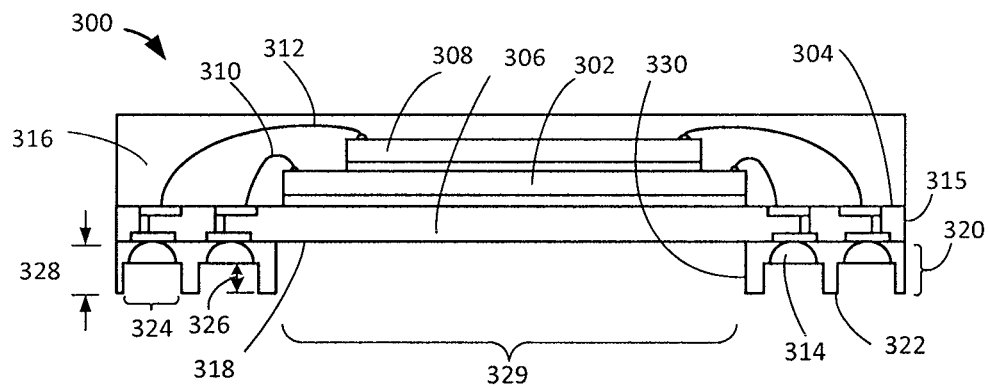
FIG. 3 is a cross-sectional view of an integrated circuit package system exemplified by the top view along line 2-2 of FIG. 1 in a second embodiment of the present invention.

Referring now to FIG. 3, therein is shown a cross-sectional view of an integrated circuit package system 300 exemplified by the top view along line 2-2 of FIG. 1 in a second embodiment of the present invention. A first integrated circuit 302, such as an integrated circuit die, can be mounted over and connected to a first side 304 of a carrier 306, such as a laminated substrate. A second integrated circuit 308, such as an integrated circuit die, can mount over the first integrated circuit 302 and can connect with the first side 304.

A first internal interconnect 310, such as a bond wire, can connect the first integrated circuit 302 to the first side 304. A second internal interconnect 312, such as a bond wire, can connect the second integrated circuit 308 and the first side 304.

An external interconnect 314, such as a solder ball, can be attached to a second side 318 of the carrier 306. For illustrative purposes, the integrated circuit package system 300 is shown with two rows of the external interconnect 314 connected along a periphery region of the carrier 306, although it is understood that the integrated circuit package system 300 can have different number of rows of the external interconnect 314. For example, the integrated circuit package system 300 can have one row of the external interconnect 314, different number of rows of the external interconnect 314 along each of carrier edges 315 of the carrier 306, or more than two rows of the external interconnect 314.

An encapsulation 316 can be over the first side 304 covering the first integrated circuit 302, the second integrated circuit 308, the first internal interconnect 310, and the second internal interconnect 312. The encapsulation 316 can also surround the external interconnect 314 along the second side 318 forming an embedded external interconnect 320. A bottom side 322 of the embedded external interconnect 320 is the side of the embedded external interconnect 320 facing away from the carrier 306.

A groove 324 can be formed in the embedded external interconnect 320 from the bottom side 322. The groove 324 can expose a portion of the external interconnect 314 facing away from the carrier 306. A groove height 326 is the distance from the bottom side 322 to the exposed portion of the external interconnect 314 in the groove 324. For illustrative purposes, the groove 324 is shown with vertical sides, although it is understood that the sides of the groove 324 can be in other configurations. For example, the groove 324 can be rounded or at an obtuse angle.

An embedded external interconnect height 328 is the distance between the second side 318 and the bottom side 322. A cavity 329 can be formed by the second side 318 and an inner vertical side 330 of the embedded external interconnect 320.

Figure 4:
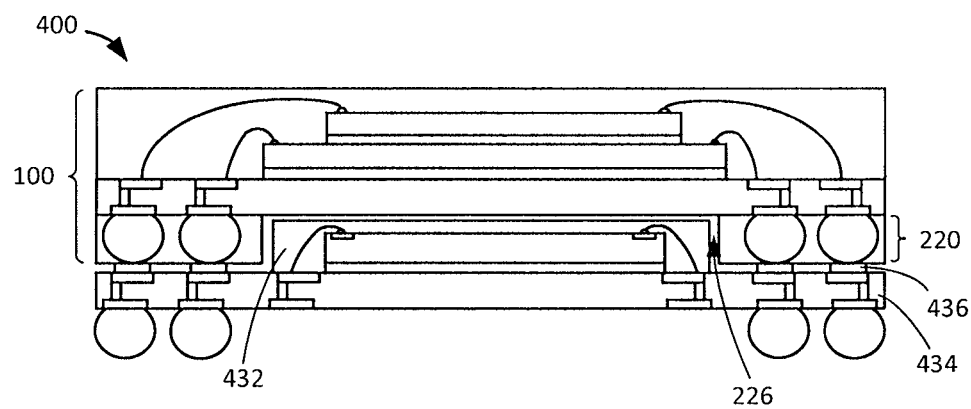
FIG. 4 is a cross-sectional view of an integrated circuit package-on-package system with a first example application of the integrated circuit package system of FIG. 2 in a third embodiment of the present invention.

Referring now to FIG. 4, therein is shown a cross sectional view of an integrated circuit package-on-package system 400 with a first example application of the integrated circuit package system 100 of FIG. 2 in a third embodiment of the present invention. The cross-sectional view depicts a device 432, such as an encapsulated integrated circuit, mounted over and connected to a mountable structure 434, such as an interposer, printed circuit board, or a laminated substrate. The integrated circuit package system 100 mounts over the mountable structure 434 with the device 432 nested in the cavity 226. A conductive structure 436, such as a conductive structure, can connect the embedded external interconnect 220 and the mountable structure 434.

It has been discovered that the present invention provides an integrated circuit package system having an embedded external interconnect improves reliability, stacking, and connectivity of integrated circuit package systems by providing structural support for the external interconnects. The embedded external interconnect provides rigid support when mounting the integrated circuit package over other mountable structures. The embedded external interconnects allows manufactures to decrease the pitch and increase the density of the external interconnects. The embedded external interconnects also provide planar rigidity preventing warpage of the integrated circuit package system. The cavity of the integrated circuit package system also reduces the height of the integrated circuit package-on-package system by providing space for nesting the device therein.

For illustrative purposes, the integrated circuit package-on-package system 400 is described with the mountable structure 434 and the device 432 thereover as discrete elements. Although it is understood that the integrated circuit package-on-package system 400 can include the mountable structure 434 and the device 432 can be included in another integrated circuit package system.

Figure 5:
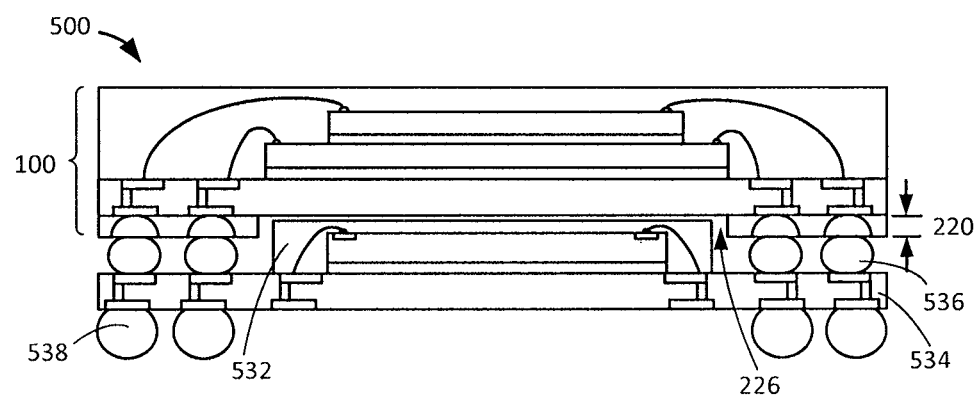
FIG. 5 is a cross-sectional view of an integrated circuit package-on-package system with a second example application of the integrated circuit package system of FIG. 2 in a fourth embodiment of the present invention.

Referring now to FIG. 5, therein is shown a cross sectional view of an integrated circuit package-on-package system 500 with a second example application of the integrated circuit package system 100 of FIG. 2 in a fourth embodiment of the present invention. The cross-sectional view depicts a device 532, such as an encapsulated integrated circuit, mounted over and connected to a mountable structure 534, such as an interposer, printed circuit board or laminated substrate. The integrated circuit package system 100 mounts over the mountable structure 534 with the device 532 nested in the cavity 226.

The embedded external interconnect height 224 can have a reduced dimension, although it is understood that the embedded external interconnect height 224 may not be altered. An intra-stack interconnect 536, such as a solder ball, can connect the integrated circuit package system 100 and the mountable structure 534. An electrical interconnect 538, such as a solder ball, can be attached under and to the mountable structure 534.

Figure 6:
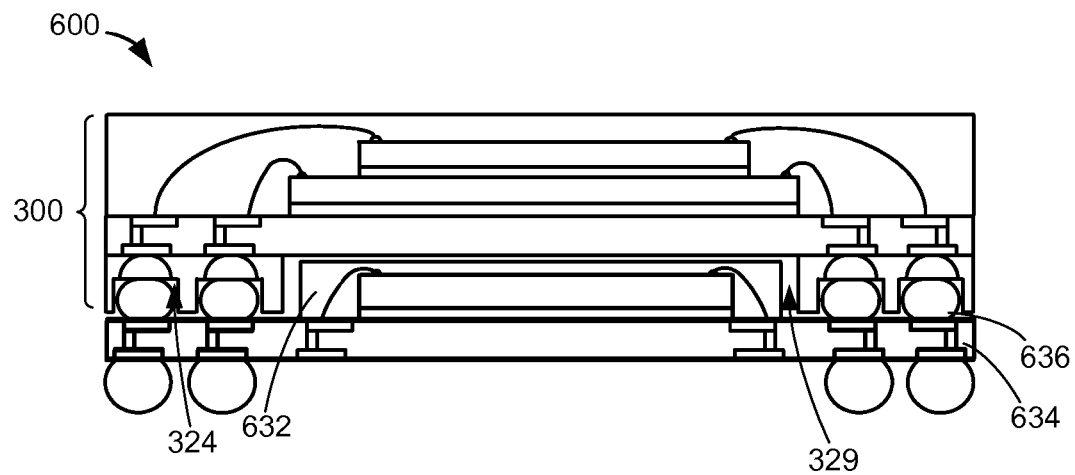
FIG. 6 is a cross-sectional view of an integrated circuit package-on-package system with a first example application of the integrated circuit package system of FIG. 3 in a fifth embodiment of the present invention.

Referring now to FIG. 6, there in is shown a cross sectional view of an integrated circuit package-on-package system 600 with a first example application of the integrated circuit package system 300 of FIG. 3 in a fifth embodiment of the present invention. The cross-sectional view depicts a device 632, such as an encapsulated integrated circuit, mounted over and connected to a mountable structure 634, such as an interposer, printed circuit board or a laminated substrate. The integrated circuit package system 100 mounts over the mountable structure 634 with the device 632 nested in the cavity 329. An intra-stack interconnect 636, such as a solder ball, can connect the integrated circuit package system 100 and the mountable structure 634 within the groove 324.

Figure 7:
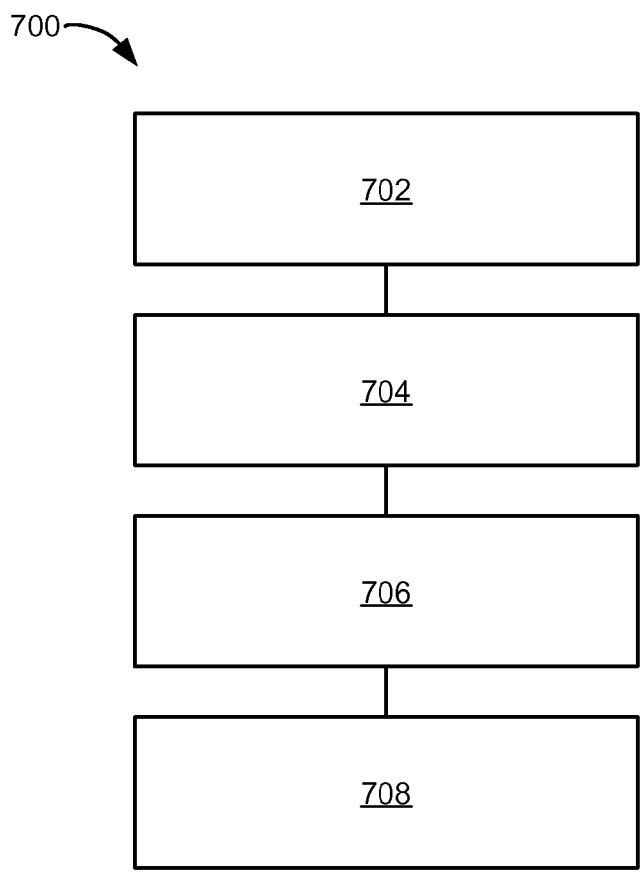
FIG. 7 is a flow chart of an integrated circuit package system for manufacture of the integrated circuit package system in an embodiment of the present invention.

Referring now to FIG. 7, therein is shown a flow chart of an integrated circuit package system 700 for manufacture of the integrated circuit package system 100 in an embodiment of the present invention. The system 700 includes providing a carrier having a first side and a second side in a block 702; mounting an integrated circuit over the carrier with the first side facing the integrated circuit in a block 704; attaching an external interconnect to the second side in a block 706; and forming an encapsulation over the integrated circuit and around the external interconnect with the external interconnect exposed from the encapsulation and with the encapsulation and the second side forming a cavity in a block 708.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit package system of the present invention furnishes important and heretofore unknown and unavailable solutions, capabilities, and functional aspects for improving reliability in systems. The resulting processes and configurations are straight-forward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit package system comprising:
   providing a carrier having a first side and a second side;
   mounting an integrated circuit over the carrier with the first side facing the integrated circuit;
   attaching an external interconnect to the second side;
   forming an encapsulation over the integrated circuit and around the external interconnect with the encapsulation and the second side forming a cavity, the external interconnect exposed from the encapsulation and the second side exposed in the cavity;
   providing a mountable structure;
   attaching an un-encapsulated conductive structure between the external interconnect and the mountable structure, wherein the un-encapsulated conductive structure has a same structure and is made of a same conductive as the external interconnect; and
   mounting an encapsulated integrated circuit on the mountable structure such that the encapsulated integrated circuit nests entirely within the cavity.

2. The method as claimed in claim 1 wherein forming the encapsulation includes exposing the external interconnect at a bottom side of the encapsulation.

3. The method as claimed in claim 1 wherein forming the encapsulation includes forming a bottom side facing away from the carrier and planar with the external interconnect.

4. The method as claimed in claim 1 wherein attaching the external interconnect includes attaching the external interconnect with a reduced dimension.

5. The method as claimed in claim 1 wherein forming the encapsulation includes forming the encapsulation having a groove in a bottom of the encapsulation and the external interconnect exposed in the groove.

6. The method as claimed in claim 5 wherein attaching the un-encapsulated conductive structure includes forming the external interconnect within the groove.

7. The method as claimed in claim 5 wherein attaching the un-encapsulated conductive structure includes forming the un-encapsulated conductive structure within the groove.

8. The method system as claimed in claim 1 further comprising mounting an electrical interconnect to the mountable structure.

9. A method of manufacturing an integrated circuit package system comprising:
  providing a carrier having a first side and a second side;
  mounting an integrated circuit over the carrier with the first side facing the integrated circuit;
  attaching an external interconnect to the second side;
  forming an encapsulation over the integrated circuit and around the external interconnect including:
    forming the encapsulation having a bottom side facing away from the carrier and with the encapsulation and the second side forming a cavity, the second side exposed in the cavity, and
    exposing the external interconnect at the bottom side;
  providing a mountable structure;
  attaching a un-encapsulated solder ball between the external interconnect and the mountable structure; and
  mounting an encapsulated integrated circuit on the mountable structure such that the encapsulated integrated circuit nests entirely within the cavity.

10. The method as claimed in claim 9 further comprising: attaching an electrical interconnect under the mountable structure.

11. The method as claimed in claim 9 wherein attaching the external interconnect includes attaching the external interconnect with a reduced dimension.

12. The method as claimed in claim 9 wherein forming the encapsulation includes forming the encapsulation having a groove in a bottom of the encapsulation and the external interconnect exposed in the groove.

13. The method as claimed in claim 9 further comprising mounting an electrical interconnect to the mountable structure.

14. An integrated circuit package system comprising:
  a carrier having both a first side and a second side;
  an integrated circuit over the carrier with the first side facing the integrated circuit;
  an external interconnect attached to the second side;
  an encapsulation over the integrated circuit and around the external interconnect with the encapsulation and the second side forming a cavity, the external interconnect exposed from the encapsulation and the second side exposed in the cavity;
  a mountable structure;
  an un-encapsulated conductive structure between the external interconnect and the mountable structure, wherein the un-encapsulated conductive structure has a same structure and is made of a same conductive material as the external interconnect; and
  an encapsulated integrated circuit over the mountable structure, wherein the encapsulated integrated circuit nests entirely within the cavity, and wherein the external interconnect is over the mountable structure.

15. The system as claimed in claim 14 wherein the external interconnect is exposed at a bottom side of the encapsulation.

16. The system as claimed in claim 14 wherein the encapsulation includes a bottom side facing away from the carrier and planar with the external interconnect.

17. The system as claimed in claim 14 wherein the external interconnect has a reduced dimension.

18. The system as claimed in claim 14 wherein the un-encapsulated conductive structure includes a solder ball.

19. The system as claimed in claim 14 wherein the encapsulation has a groove in a bottom of the encapsulation and the external interconnect exposed in the groove.

20. The system as claimed in claim 19 wherein the un-encapsulated conductive structure is within the groove.

* * * * *

UNITED STATES PATENT AND TRADEMARK OFFICE
CERTIFICATE OF CORRECTION

| | | |
|---|---|---|
| PATENT NO. | : 8,823,160 B2 | Page 1 of 1 |
| APPLICATION NO. | : 12/197209 | |
| DATED | : September 2, 2014 | |
| INVENTOR(S) | : Ha et al. | |

It is certified that error appears in the above-identified patent and that said Letters Patent is hereby corrected as shown below:

In the Claims:

Column 6, Claim 1, line 45, delete "conductive as" and insert therefor
--conductive material as--

Signed and Sealed this
Twenty-second Day of March, 2016

Michelle K. Lee
*Director of the United States Patent and Trademark Office*